United States Patent
Weniger et al.

(10) Patent No.: US 8,125,653 B2
(45) Date of Patent: Feb. 28, 2012

(54) APPARATUS AND METHOD FOR THE DETERMINATION OF THE POSITION OF A DISK-SHAPED OBJECT

(75) Inventors: Gert Weniger, Jena (DE); Ulrich Pohlmann, Jena (DE); Frank Rennicke, Grosspuerschuetz (DE)

(73) Assignee: Vistec Semiconductor Systems Jena GmbH, Jena (DE)

( * ) Notice: Subject to any disclaimer, the term of this patent is extended or adjusted under 35 U.S.C. 154(b) by 224 days.

(21) Appl. No.: 12/556,175

(22) Filed: Sep. 9, 2009

(65) Prior Publication Data

US 2010/0085582 A1    Apr. 8, 2010

(30) Foreign Application Priority Data

Oct. 7, 2008  (DE) .......................... 10 2008 037 419

(51) Int. Cl.
*G01B 11/14* (2006.01)
(52) U.S. Cl. ........................................ 356/621; 356/614
(58) Field of Classification Search .................. 356/621, 356/614, 237.2–237.6
See application file for complete search history.

(56) References Cited

U.S. PATENT DOCUMENTS

| | | | |
|---|---|---|---|
| 7,209,227 B2 * | 4/2007 | Smedt | 356/237.2 |
| 2003/0031537 A1 | 2/2003 | Tokunaga | |
| 2006/0187445 A1 | 8/2006 | Smedt | |
| 2008/0208523 A1 | 8/2008 | Schenck et al. | |
| 2008/0218751 A1 * | 9/2008 | Togashi et al. | 356/237.5 |

* cited by examiner

*Primary Examiner* — Tri T Ton
(74) *Attorney, Agent, or Firm* — Houston Eliseeva, LLP

(57) ABSTRACT

The invention relates to an apparatus for the determination of the position of a disc-shaped object, particularly of a wafer (10). Thereby, a mount (14) for supporting the sensor device (11) is provided on a movable carrier (22).

9 Claims, 3 Drawing Sheets

APPARATUS AND METHOD FOR THE DETERMINATION OF THE POSITION OF A DISK-SHAPED OBJECT

RELATED APPLICATIONS

This application claims priority to German Patent Application No. DE 10 2008 037 419.9, filed Oct. 7, 2008, which is incorporated herein by reference in its entirety.

FIELD OF THE INVENTION

The present invention relates to an apparatus for the determination of the position of a disc-shaped object, particularly of a wafer.

Furthermore, the invention relates to a method for detecting the position of a disc-shaped object, particularly of a wafer.

In addition, the invention relates to a mount for supporting a sensor device.

BACKGROUND OF THE INVENTION

As for the industrial production of chips for the semiconductor industry, integrated circuits on disc-shaped objects are produced by several consecutive process steps. In line with this production it is necessary that the individual disc-shaped carrier, which are in the following also referred to as wafers, need to be transported from one process station to another process station or an inspection station. Usually a so called movable carrier is used hereunto which extracts the wafer from a pile and transports it to a device for the inspection of the wafer, for example. Such a wafer processing apparatus for wafers with a related movable carrier is known from US 2003/0031537 A1, for example. The wafer processing apparatus described therein is also provided with a movable carrier with which the wafers are transferred from a load port to an inspection station.

It is necessary to ensure during the transfer into the inspection device that the wafer is inserted in a processing station in a preferably defined manner, particularly centered. Hereunto, a retainer for holding a wafer is known from US 2006/187445 A1, for example, having four contacting elements onto which the wafer is positioned. For further improvement, a method for determining geometric parameters of a wafer was already suggested in DE 10 2007 010 223. For this purpose, the wafer is inserted by a movable carrier in a retainer, wherein said retainer is equipped with at least three mechanical contacting elements onto which the wafer is positioned. One of the contacting elements is movable. The contacting elements are arranged on the retainer in such a way that they define a geometric figure which is designed in such a way that the center point of the wafer lies within the geometric figure. The position of each contacting element is determined. Each desired geometric parameter of the wafer is then calculated from the position of the contacting elements.

SUMMARY OF THE INVENTION

The object of the present invention is to provide an apparatus for the determination of the position of a disc-shaped object wherein the reliability of the positioning of the disc-shaped object is improved.

This object is achieved by an apparatus for the determination of the position of a disc-shaped object, particularly of a wafer. The apparatus comprises a movable carrier; a mount for supporting a sensor device; and a sensor device provided on the mount wherein the mount is positioned at the movable carrier.

A further object of the present invention is to provide a method for the determination of the position of a disc-shaped object wherein the reliability of the positioning of the disc-shaped object is improved.

The object is achieved by a method for the determination of the position of a disc-shaped object, in particular of a wafer, on a movable carrier, comprises the following steps:

positioning the disc-shaped object on the movable carrier, wherein a mount is attached to a movable carrier;

generating a signal with a sensor device which is provided on the mount;

determining data from the signal wherein said data suggest geometric parameter, particularly the position of the edge of the disc-shaped object or of the center point of the disc-shaped object.

Another object of the present invention is to provide a suitable mount for detecting the position of a disc-shaped object, wherein the reliability of the positioning of the disc-shaped object is improved.

The above object is achieved by a mount for supporting a sensor device. The mount comprises an optical sensor device provided on the mount, wherein the CCD sensors, which are at least partially shadowed during the positioning of a disc-shaped object on the mount.

Accordingly an apparatus for the determination of the position of a disc-shaped object is suggested by the present invention, wherein the object can be a wafer in particular. The apparatus is provided with a movable carrier and a mount for supporting a sensor device. The sensor device is preferably inserted into the mount or mounted thereon, wherein the mount is connected with the carrier and the carrier can be designed in a movable manner.

A frequent use of such an apparatus is that, wherein the movable carrier is a robot arm of an end effector module. Thereby, the robot arm can be designed in a forked manner, in particular, wherein the mount is fixed on said forked robot arm.

In a preferred embodiment of the invention the sensor device is designed as an optical sensor device, particularly as a plurality of CCD sensors. Therewith, the position of an object, which is positioned on the mount, can be detected contactless by the shadowing of the CCD sensors.

Furthermore, the mount is preferably carried out in such a way that it is provided with a first arm and a second arm. Thereby, the CCD sensors are positioned in pairs on each of the arms, so that a first pair of the CCD sensors is positioned on the first arm and a second pair of the CCD sensors is positioned on the second arm. The CCD sensors on the first arm and/or on the second arm can be offset relative to each other in direction of the arm axis. Therewith, an easy possibility is created to calculate the center point or other geometric data of a disc-shaped object which is positioned on the mount.

The mount can be designed in such a way that it is provided with a connecting arm for easily connecting the mount with the movable carrier as well as with a sensor plate. Thereby, the sensor elements are positioned on the sensor device.

For the determination of the position of the disc-shaped object, the disc-shaped object is positioned on the movable carrier in such a way that it at least partially shadows the mount, wherein the mount is fixed at the movable carrier. A signal is generated with a sensor device which is provided at the mount. Data are determined then from the signal which suggest geometric parameter, particularly the position of the edge or the center point of the disc-shaped object.

In a particularly preferred embodiment of the method according to the invention, a plurality of optical elements, particularly CCD sensors, is used as a sensor device. Thus the mount can be moved with the disc-shaped object into a measuring position where an illumination is carried out. Therewith it can be determined if and, if necessary, which parts of the optical elements are shadowed by the disc-shaped object during illumination. Therewith, the edge of the object as well as its center point can be contactless determined.

As soon as the geometric data are determined, it can furthermore be examined if the object is correctly positioned, that is within a predetermined range for the determined geometric data. If this is not the case, the object can be positioned again and/or an error is displayed. Likewise, it is possible to pick up the object again after positioning in order to correct the position on the movable carrier, wherein the already determined geometric data regarding the positioning of the object can be considered.

The mount for supporting a sensor device according to the invention is provided with an optical sensor device, particularly CCD sensors. When positioning the disc-shaped object onto the mount, these CCD sensors are at least partially shadowed.

An embodiment of the mount is particularly preferred, wherein said mount is provided with a first arm and a second arm. On each of the arms, one pair of the CCD sensors is arranged. Thereby, an embodiment is of particular advantage, wherein the CCD sensors positioned on the first arm are offset relative to each other in direction of the arm axis and/or the CCD sensors positioned on the second arm are offset relative to each other in direction of the arm axis. Therewith, the positioning of the disc-shaped object is exactly and contactless determinable on the mount, since the geometric data result from the different shadowings of the CCD sensors, as well as their distance and offset to each other, wherein both data for the design of the mount are constant and known.

The above and other features of the invention including various novel details of construction and combinations of parts, and other advantages, will now be more particularly described with reference to the accompanying drawings and pointed out in the claims. It will be understood that the particular method and device embodying the invention are shown by way of illustration and not as a limitation of the invention. The principles and features of this invention may be employed in various and numerous embodiments without departing from the scope of the invention.

BRIEF DESCRIPTION OF THE DRAWINGS

In the accompanying drawings, reference characters refer to the same parts throughout the different views. The drawings are not necessarily to scale; emphasis has instead been placed upon illustrating the principles of the invention. Of the drawings.

DETAILED DESCRIPTION OF THE PREFERRED EMBODIMENTS

Figure 1:
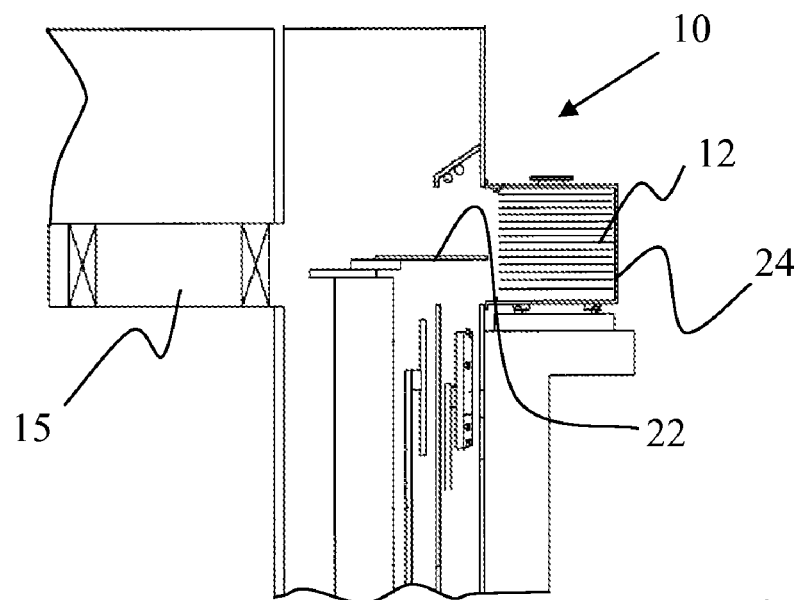
FIG. 1 shows a schematic view of a wafer handling apparatus for transporting wafers with a robot arm.

FIG. 1 shows schematically a wafer handling apparatus 10 for transporting wafers 12 with a movable carrier 22. In the semiconductor production the wafer handling apparatus 10 is generally referred to as end effector module (EFEM). A plurality of wafers 12 is stored in a load station 24. From there, a single wafer 12 is removed by the movable carrier 22 and transported into a processing station or inspection station 15. In the processing station or inspection station 15, the wafer 12 is generally supported in a receiving unit known from US 2006/187445, for example. In order to improve the exact positioning of the wafer in the processing station or inspection station 15, it is advantageous to determine and, if necessary, correct the position of the wafer 12 on the movable carrier 22 already when removing said wafer off the load station 24. Thereby, a reliable initial position is achieved and the process of positioning the wafer improved as for exact positioning.

Figure 2:
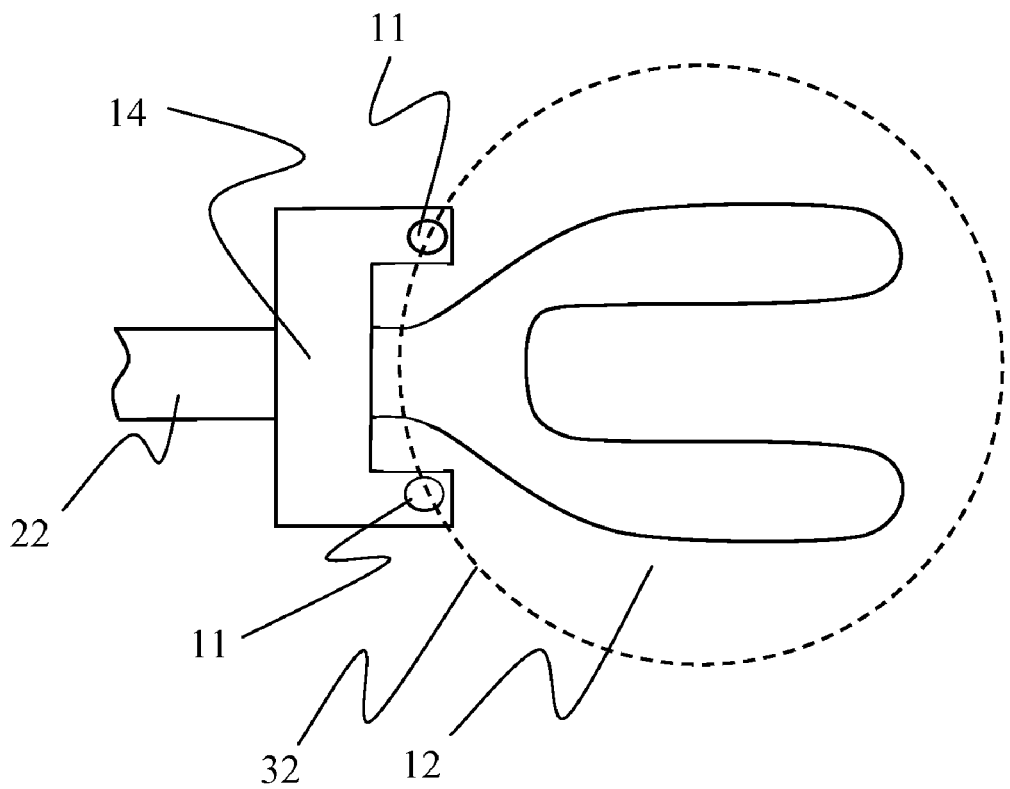
FIG. 2 shows a schematic view of the apparatus for the determination of the position of a disc-shaped object according to the invention.

The schematic view in FIG. 2 shows accordingly the apparatus for the determination of the position of a disc-shaped object subject to the invention on the basis of an also schematically shown wafer 12. Thereby, the apparatus is designed in such a way that a mount 14 is on a movable carrier 22 in the example at hand. With the movable carrier 22 a wafer 12 can be removed from the load station 24 (FIG. 1). The mount 14 is attached as an additional element on the movable carrier 22 and serves for mounting of at least a sensor device 11. The sensor device 11 is suitable for determining the positioning of a wafer 12 which is positioned on a movable carrier 22. In the shown example the two sensor devices 11 are partially shadowed by the wafer 12, so that parts of the edge 32 of the wafer 12 run geometrically through the sensor device 11. The positioning of the wafer 12 on the movable carrier 22 can be determined to the extent of shadowing of the sensor devices 11. The sensor device 11 can be carried out, for example, as an optical element which emits light or is able to detect incident light. With such an optical element, a conclusion can already be drawn on the degree of the shadowing of the optical element by the intensity of the incident light, what from the positioning of the wafer 12 on the movable carrier 22 can be determined in turn. If the optical elements emit light, then the positioning of the wafer 12 on the movable carrier 22 can be determined in such a way that with a suitable positionable receiver it is determined how much light and/or from which positions light is received from the mount 14, since this is determined by the shadowing of the sensor device 11 by the wafer 12.

Figure 3:
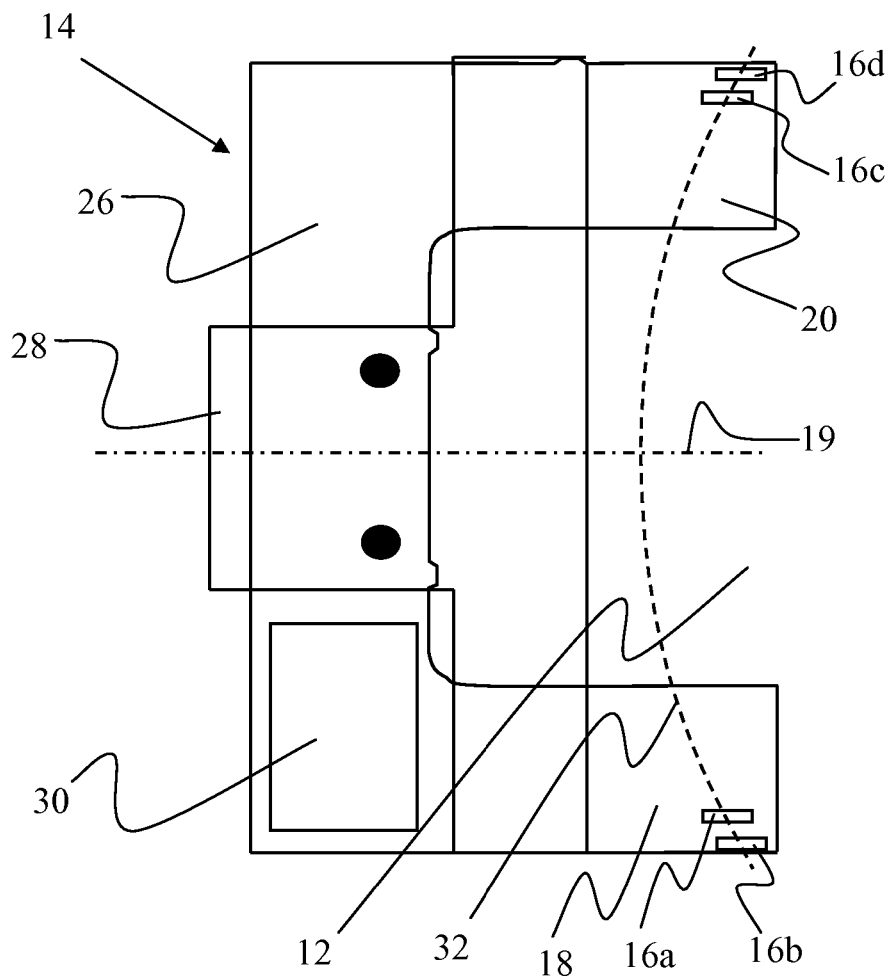
FIG. 3 shows a top view onto a mount having a plurality of CCD sensors.

A preferred embodiment of a mount 14 which is provided with a plurality of CCD sensors 16a, 16b, 16c, 16d is described in more detail in FIG. 3. The mount 14 is carried out in a horseshoe-shaped manner. Said mount 14 is provided with a connecting arm 28 for fastening the mount 14 on the movable carrier 22. Furthermore, the mount 14 is provided with a sensor plate 26. The sensor plate 26 and thus the mount 14 are provided with a first arm 18 and a second arm 20, each of the arms ranging along an arm axis 19. At the ends of the arms 18 and 20 one pair of CCD sensors 16a, 16b, and 16c, 16d is arranged in each case. Each of the CCD sensors is provided with a plurality of light-sensitive elements. Preferably, each pair of the CCD sensors 16a, 16b, and 16c, 16d is offset relative to each other in direction of the arm axis 19. If a wafer 12 is positioned on the movable carrier 22, then the wafer normally shadows each of the CCD sensors, wherein the edge 32 of the wafer 12 runs through the CCD sensors 16a, 16b, 16c, 16d at different positions. From the relative displacement of the pairs of the CCD sensors 16a, 16b, and 16c, 16d relative to each other and from the extent of shadowing of the single CCD sensors 16a, 16b, 16c, 16d, geometric parameters such as the run of the edge 32 of the wafer 12 or the position of its center point can be determined. These parameters characterize the positioning of the wafer 12 on the movable carrier 22. An evaluation system 30 is provided on the mount 14 for the determination of these parameters from the sensor signals, wherein said evaluation system 30 can be designed as an electronic circuit or as an integrated circuit unit.

Figure 4:
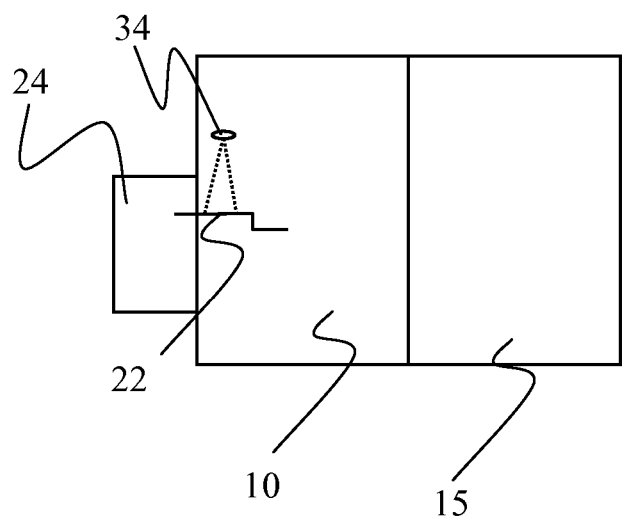
FIG. 4 shows a schematic view for inserting a disc-shaped object into a measuring position.

As for determining the position it is necessary in this embodiment of the invention that the CCD sensors are illuminated. As schematically shown in FIG. 4, a wafer 12 is thus removed by the movable carrier 22 from the load station 24 in such a way that said wafer 12 is partially positioned on the mount 14, too. The movable carrier 22 moves into a measuring position then in which an illumination 34 is activated. Thus, the position of the wafer on the movable carrier 22 can be determined by the CCD sensors 16a, 16b, 16c, 16d described above, wherein the shadowing of the CCD sensors is determined. If the positioning is adequately correct on the movable carrier 22, that is if the determined geometric data are within predetermined limits of tolerance, then the wafer can be further transported to the processing station or inspection station 15. If this is not the case, the wafer 12 can be again moved back to the load station 24 and again be removed by the movable carrier 22 in an improved positioning.

Figure 5:
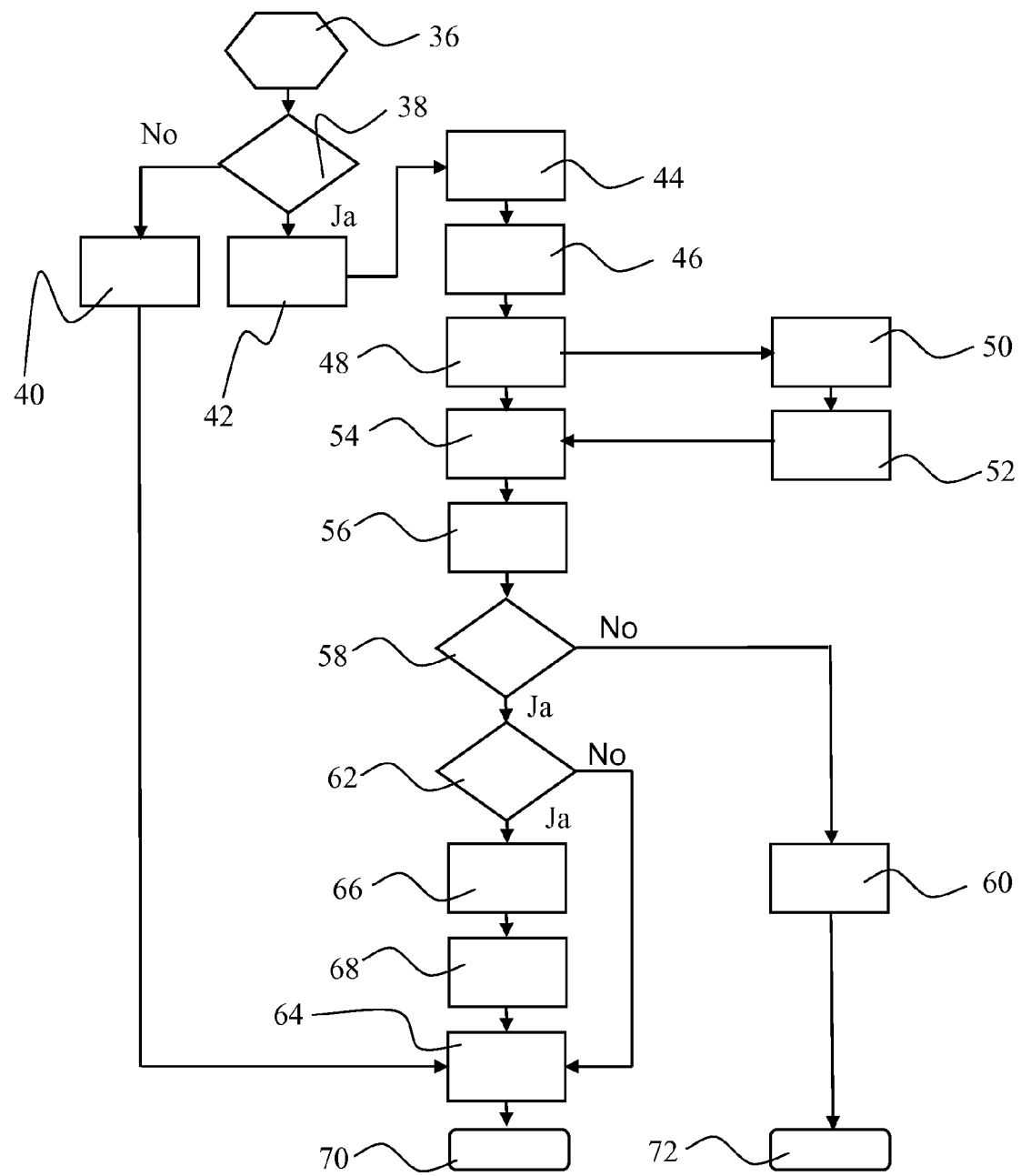
FIG. 5 shows a schematic view of a flow chart of the process for the determination of the position of a disc-shaped object.

FIG. 5 schematically shows the process of the method according to the invention on the basis of a flow chart. At the starting point 36 of the method the movable carrier 22 is positioned in front of the load station 24. In the inspecting step 38 it is determined if a positioning measurement is necessary at all. If it is not necessary, a wafer 12 without measurement is removed in step 40, being completely withdrawn in step 64 and the procedure finished in step 70.

Before measurement it has to be considered that the current position of the wafer 12 has to be defined on the end effector before measurement. For this purpose, the home position can be defined in an initial process, for example. The determined initial position correction parameters can always be referred to this position afterwards. The physical home position must be producible as the current home position which is preferably carried out by means of a button in the software.

If a positioning measurement is carried out, then the measurement process begins in step 42. In step 44 firstly a wafer 12 is removed from the load station 24 for measurement and moved into a measurement position. The illumination is activated in step 46. The real measurement of the position of the wafer 12 on the movable carrier 22 can be started in step 48 afterwards. For this purpose, the rows of the CCD sensors are readout firstly in step 50 and the geometric data of the positioning of the wafer 12 determined on the basis of the determined signals. After the calculation is finished, the determined results or errors arising from the calculation can be transferred, for example, as error codes in step 52. These results are awaited therefore in step 54.

The determined positioning parameters can be set with reference to a previously defined or a teached home position and a physical that is a calibrated home position. Dependant on that it is being decided whether a correction of the positioning is necessary or not. These data can also be stored in a log file.

Errors may incur if the shadowing of the sensor is too large or too small, so that a measurement is not possible. On the basis of an initialization it is furthermore possible to determine that the sensor devices used or that the sensor device used are defective or not calibrated. Likewise it is possible to transmit a general or unknown error.

After the result has been transmitted, the illumination is switched off in step 56. Afterwards one checks in step 58 if the measurement was successful. In particular, this is not the case if an error has been transmitted. In this case, the wafer 12 is again moved back into the load station in step 60 and the removal process cancelled in step 72.

If the measurement was successful then an examination is carried out in step 62 to that effect if the determined position and the determined geometric parameter respectively are positioned outside a predetermined tolerance. If this is not the case the wafer 12 can be completely removed from the load station 24 in step 64 and can be passed to the processing station or inspection station 15.

If the acceptable tolerance parameter has been exceeded, however, then the wafer 12 is positioned on the movable carrier 22 that wrong that a transfer to the processing station and inspection station 15 cannot be carried out in a definite manner. In step 66 the wafer 12 is again moved back into the load station 24 and the error is corrected in step 68. The correction can be carried out either by removing the wafer with the movable carrier considering the correction parameters or manually by a user. The removal of the wafer 12 is finished in step 70.

While this invention has been particularly shown and described with references to preferred embodiments thereof, it will be understood by those skilled in the art that various changes in form and details may be made therein without departing from the scope of the invention encompassed by the appended claims.

What is claimed is:

1. An apparatus for the determination of the position of a disc-shaped object, particularly of a wafer, comprising a movable carrier; a mount for supporting a sensor device; and a sensor device provided on the mount wherein the mount is positioned at the movable carrier;
   wherein the mount is an optical sensor device, particularly CCD sensors;
   wherein at least four CCD sensors are provided on the mount;
   wherein the mount is provided with a first arm and a second arm and a first pair of the CCD sensors being positioned on the first arm and a second pair of the CCD sensors being positioned on the second arm;
   wherein the CCD sensors, which are positioned on the first arm, are offset relative to each other in direction of the arm axis; and
   wherein the CCD sensors, which are positioned on the second arm, are offset relative to each other in direction of the arm axis.

2. The apparatus of claim 1, wherein the movable carrier is a robot arm of an end effector module.

3. The apparatus of claim 1, wherein the mount is provided with a connecting arm for connecting the mount with the movable carrier and with a sensor plate, onto which the sensor device is mounted.

4. The apparatus of claim 1, wherein the mount is having an evaluation system, with which an evaluation of the position of the wafer can be carried out on the mount.

5. A method for the determination of the position of a disc-shaped object, in particular of a wafer, on a movable carrier, comprises the following steps:

positioning the disc-shaped object on the movable carrier, wherein a mount is attached to a movable carrier;

generating a signal with a sensor device which is provided on the mount;

determining data from the signal wherein said data suggest geometric parameter, particularly the position of the edge of the disc-shaped object or of the center point of the disc-shaped object;

wherein the mount is an optical sensor device, particularly CCD sensors;

wherein at least four CCD sensors are provided on the mount;

wherein the mount is provided with a first arm and a second arm and a first pair of the CCD sensors being positioned on the first arm and a second pair of the CCD sensors being positioned on the second arm;

wherein the CCD sensors, which are positioned on the first arm, are offset relative to each other in direction of the arm axis; and wherein the CCD sensors, which are positioned on the second arm, are offset relative to each other in direction of the arm axis.

6. The method of claim 5, wherein the signal is generated in such a way that the mount moves with the disc-shaped object in a measuring position, in which the illumination of the optical elements is carried out.

7. The method of claim 6, wherein from the signal it is determined by an evaluation, if or which parts of the optical elements are shadowed by the disc-shaped object during illumination.

8. The method of claim 5 wherein the determined geometric data are analyzed for being within a predetermined range.

9. The method of claim 8, wherein the disc-shaped object is positioned again on the movable carrier or an error is displayed, if the determined geometric data are outside the predetermined range.

* * * * *